United States Patent [19]
Kornachuk et al.

[11] Patent Number: 5,965,925
[45] Date of Patent: Oct. 12, 1999

[54] INTEGRATED CIRCUIT LAYOUT METHODS AND LAYOUT STRUCTURES

[75] Inventors: Steve P. Kornachuk; Scott T. Becker, both of San Jose, Calif.

[73] Assignee: Artisan Components, Inc., Sunnyvale, Calif.

[21] Appl. No.: 08/956,203

[22] Filed: Oct. 22, 1997

[51] Int. Cl.$^6$ ............ H01L 29/76; H01L 29/94; H01L 31/062; H01L 31/113
[52] U.S. Cl. ............................................ 257/401; 257/355
[58] Field of Search ..................................... 257/401, 335

[56] References Cited

U.S. PATENT DOCUMENTS

| | | | |
|---|---|---|---|
| 4,128,900 | 12/1978 | Lappington | 365/94 |
| 4,532,534 | 7/1985 | Ford et al. | |
| 4,642,674 | 2/1987 | Schoofs . | |
| 5,029,135 | 7/1991 | Okubo | 365/203 |
| 5,091,889 | 2/1992 | Hamano et al. | 365/233.5 |
| 5,146,427 | 9/1992 | Sasaki et al. | 365/189.05 |
| 5,214,609 | 5/1993 | Kato et al. | 365/230.01 |
| 5,311,471 | 5/1994 | Matsumoto et al. | 365/189.05 |
| 5,341,013 | 8/1994 | Koyanagi et al. | |
| 5,355,008 | 10/1994 | Moyer et al. | |
| 5,404,334 | 4/1995 | Pascucci et al. | 365/210 |
| 5,414,663 | 5/1995 | Komarek et al. | 365/210 |
| 5,459,689 | 10/1995 | Hikichi | 365/189.01 |
| 5,475,252 | 12/1995 | Merrill et al. | |
| 5,485,430 | 1/1996 | McClure | 365/233 |
| 5,508,965 | 4/1996 | Nomura et al. | 365/206 |
| 5,555,521 | 9/1996 | Hamada et al. | 365/185.03 |
| 5,561,629 | 10/1996 | Curd | 365/185.21 |
| 5,596,539 | 1/1997 | Passow et al. | 365/210 |
| 5,608,681 | 3/1997 | Priebe et al. | 365/207 |
| 5,625,586 | 4/1997 | Yamasaki et al. | 365/104 |
| 5,636,161 | 6/1997 | Mann | 365/185.21 |
| 5,654,919 | 8/1997 | Kwon | 365/185.21 |
| 5,694,369 | 12/1997 | Abe | 365/210 |
| 5,699,295 | 12/1997 | Yero | 365/185.21 |

*Primary Examiner*—Stephen D. Meier
*Attorney, Agent, or Firm*—Hickman & Martine, LLP

[57] ABSTRACT

Disclosed is a semiconductor layout design for use in integrated circuits that use balance circuitry. The semiconductor layout design includes a set of four substantially self enclosing gate transistors being arranged symmetrically about a common point. Wherein, each of the set of four substantially self enclosing gate transistors have a gate width that is defined by a perimeter around each of the set of four substantially self enclosing gate transistors. The semiconductor layout design preferably includes a balanced circuit having a set of first transistors and a set of second transistors. The set of first transistors being wired diagonally across the set of four substantially self enclosing gate transistors. In a preferred embodiment, the set of second transistors are wired diagonally across the set of four substantially self enclosing gate transistors in a manner that ensures that the set of second transistors are wired substantially perpendicular to the set of first transistors.

24 Claims, 6 Drawing Sheets

INTEGRATED CIRCUIT LAYOUT METHODS AND LAYOUT STRUCTURES

BACKGROUND OF THE INVENTION

1. Field of the Invention

The present invention relates generally to integrated circuits, and more particularly to methods and apparatus for improved integrated circuit layout techniques.

2. Description of the Related Art

In the design of integrated circuits, serious consideration is typically placed on ensuring that the circuit design not only meet operational specifications, but also anticipated fabrication imperfections. For example, when an integrated circuit is initially designed, all of the circuit elements and interconnections are characterized by numerous lines and shapes that are intended to lie on one or more levels of a device. It is therefore these lines and shapes of the integrated circuit device that will typically undergo the fabrication imperfections when the lines and shapes are fabricated onto a semiconductor wafer.

Typically, these imperfections are due to layers being deposited or grown at different rates throughout the surface of the wafer, to the etching variations, to diffusion dopant variations, to photolithography errors or misalignments, etc. Because these imperfections are anticipated by those who design integrated circuits on semiconductor devices, designers typically build some amount of tolerance into their designs. Commonly, these built-in tolerances are characterized by designing devices slightly larger than optimum, or designing devices having a less dense arrangement. Although most circuit devices can handle such imperfections by making a number of modifications to a design, balanced-type circuits are typically affected more severely, even when the fabrication imperfection is small.

Generally, a balanced circuit is one that requires complementary devices to have the same drive strength, to have the same input capacitance, and to have the same output load. For ease of description, FIG. 1A shows a cross-sectional view of a semiconductor device having a pair of transistors that may be part of a balanced circuit. In balanced circuits, the fabrication imperfections that occur between devices oriented in close proximity of each other is some times referred to as a "local mismatch." As used herein, a local mismatch may be between devices that are designed to be within about 20 microns of separation. These local mismatches are what cause an imbalance in the circuit that should ideally be balanced.

By way of example, the cross-sectional view of the semiconductor device shows a first transistor device 14 having diffusion regions 15, a gate oxide 18 and a polysilicon gate 16. Separated by a field oxide 13 is a second transistor device 20 that also has diffusion regions 15, a gate oxide 18' and the polysilicon gate 16. In this example, the diffusion regions 15 are n+ doped regions and a well 12 in a semiconductor wafer 10 is p+ doped. As illustrated, the gate oxide 18 in the first transistor device 14 has a thickness Ox (H), which is about 10% thinner than the gate oxide 18' in the second transistor device 20 that has a thickness of Ox (H+$\Delta$H). Because of this local mismatch, a balanced circuit that utilizes transistors 14 and 20 will necessarily experience unequal drive strength. For example, the first transistor device 14 will generally turn ON faster than the second transistor device 20 due to the thinner gate oxide thickness Ox (H).

Another problem that tends to occur during normal fabrication is an unequal application of impurities when the doping processes are performed. Again, FIG. 1A illustrates the doping profile in the well 12 that may occur when the region under the second transistor device 20 is doped with a high concentration of dopant atoms (i.e., p++), and the region under the first transistor 14 is doped with a lighter concentration of dopant atoms (i.e., p+). As pictorially shown, the doping profile has a depth of about D under the first transistor device 14, which increases up to about D+$\Delta$D under the second transistor device 20.

When this occurs, a channel 11 of the first transistor device 14 will form before a channel 11' forms in the second transistor device 20, because the mobility of the carriers in the diffusion region 15 is higher in channel 11. In addition, the lighter doping under the first transistor device 14 will provide improved current carrying capabilities over the second transistor device 20. As can be appreciated, these local mismatches will necessarily cause a balanced circuit, such as those used in memory sense amplifying circuitry to operate in a state that is less than optimum.

FIG. 1B shows another problem that may occur due to known and expected fabrication imperfections. FIG. 1B provides a top view 40 of a the semiconductor structure of FIG. 1A, which illustrates a problem. The problem is most evident in the etching imperfections that produced the widths of the polysilicon gates 16. For example, the length of the polysilicon gate 16 of the first transistor device 14 is shown to be L+$\Delta$L, while the length of the polysilicon gate 16 of the second transistor device 20 is only L. As is well known to those skilled in the art, when the length of a transistor is longer, the transistor will turn ON with less current drive than those with narrower gate lengths. As a result, the drive strength and input capacitance differences produced by the local mismatch of these transistors in, for example, balanced memory sense amplifying devices may be less than acceptable in a given application.

FIG. 1C is a top view of the semiconductor device of FIG. 1A, which is provided to illustrate yet another type of anticipated fabrication imperfection that is counterproductive in balanced circuit applications. In this example, the fabrication imperfection may be a result of misalignments in reticle masks used in a stepper apparatus that is used in the photolithography process. Therefore, the polysilicon gates 16 are shown shifted to the right, to simulate the result of a misalignment. When this type of misalignment occurs, the area in the diffusion regions 15 change, thereby causing a variation in output load capacitance. As shown, the first transistor device 14 is shown having a drain 15a that is substantially larger than the drain 15a' in the second transistor device 20. Similarly, the source 15b in the first transistor device 14 is substantially smaller than the source 15b' in the second transistor device 20.

Although these variations are known and anticipated by those who design semiconductor devices, when the circuits being fabricated are balanced circuits, these variations produce substantially inferior performance, especially when the balanced circuits are implemented in sense amplification devices that are used to detect very slight changes in voltage. Therefore, if the balanced circuit is implemented in a sense amplification device, the variations in capacitance produced by the misalignments of FIG. 1C will necessarily make it very difficult for the balanced circuit to detect very small changes in voltage, for example, a change in voltage from a pre-charge voltage level. In addition, because the drain 15a has a substantially larger capacitance (i.e., larger load) than drain 15a', the switching speed of the first transistor device 14 will be much slower than the switching speed of the second transistor device 20.

In sum, all of these local mismatches in balanced circuits generally force designers to accept circuit designs that are less than optimum. In fact, when the local mismatch becomes too large, the balanced circuit may even fail to operate for its intended purpose.

In view of the foregoing, there is a need for improved semiconductor device layout techniques that assist balanced circuits in being more resilient to fabrication imperfections that cause mismatches.

SUMMARY OF THE INVENTION

Broadly speaking, the present invention fills these needs by providing methods and apparatuses for improved semiconductor layout techniques that substantially reduce mismatches in balanced circuits. It should be appreciated that the present invention can be implemented in numerous ways, including as a process, an apparatus, a system, a device, or a method. Several embodiments of the present invention are described below.

In one embodiment, a balanced circuitry layout is disclosed. The balanced circuitry layout includes a set of four transistors that are symmetrically arranged around a common centroid. Each of the set of four transistors have a donut shape, such that the donut shape defines a self enclosing gate having a gate length, and a gate width that is defined by a perimeter around the self enclosing gate. The balanced circuitry layout preferably includes a balanced circuit that is wired on the set of four transistors, such a first portion of the balanced circuit is wired in a first diagonal orientation across the common centroid and a second portion of the balanced circuit is wired in a second diagonal orientation across the common centroid.

In another embodiment, a method for laying out balanced circuitry is disclosed. The method includes arranging a set of four transistors around a common centroid. Each of the four transistors have a donut shape, such that the donut shape defines a self enclosing gate having a gate length, and a gate width that is defined by a perimeter around the self enclosing gate. The method preferably includes wiring a balanced circuit on the set of four transistors, such a first portion of the balanced circuit is electrically coupled in a first diagonal orientation across the common centroid, and a second portion of the balanced circuit is electrically coupled in a second diagonal orientation across the common centroid.

In yet another embodiment, a semiconductor layout design is disclosed. The semiconductor layout design includes a set of four substantially self enclosing gate transistors being arranged symmetrically about a common point. Wherein, each of the set of four substantially self enclosing gate transistors have a gate width that is defined by a perimeter around each of the set of four substantially self enclosing gate transistors. The semiconductor layout design preferably includes a balanced circuit having a set of first transistors and a set of second transistors. The set of first transistors being wired diagonally across the set of four substantially self enclosing gate transistors. In a preferred embodiment, the set of second transistors are wired diagonally across the set of four substantially self enclosing gate transistors in a manner that ensures that the set of second transistors are wired substantially perpendicular to the set of first transistors.

Advantageously, the various embodiments of the present invention provide a method and apparatus for reducing the mismatch effects experienced in balanced circuits when fabrication imperfections occur. A particularly advantageous feature of the present invention is that it does not matter in which direction the fabrication imperfections occur. This is true so long as a first portion of the balanced device is laid out diagonally across the common centroid layout arrangement and a second portion is laid out diagonally across the common centroid layout arrangement, and perpendicular to the first portion. Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

An invention for improved semiconductor layout techniques that substantially reduces mismatches in balanced circuits is disclosed. In the following description, numerous specific details are set forth in order to provide a thorough understanding of the present invention. It will be understood, however, to one skilled in the art, that the present invention may be practiced without some or all of these specific details. In other instances, well known process operations have not been described in detail in order not to unnecessarily obscure the present invention.

The following description of the preferred embodiments assumes that the fabrication imperfections tend to have distribution profiles that gradually increase or decrease over a given local mismatch area. For example, an increase or decrease in gate oxide thickness tends to occur in a direction that is generally unknown until cross-section inspections with, for example, electron microscopy is performed. In the prior art illustration provided in FIG. 1A, a 10% (more or less) gradual increase in gate oxide is believed to occur in the local mismatch area stretching between the first transistor device 14 and the second transistor device 20 of FIGS. 1A through 1C.

Figure 1A:
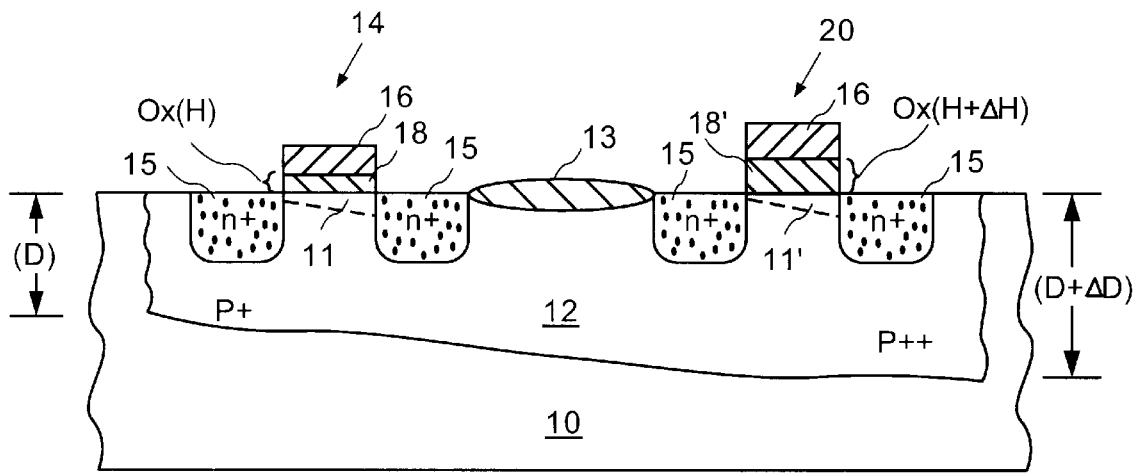
FIGS. 1A through 1C show prior art semiconductor fabrication imperfections that cause local mismatches in balanced circuits.

FIG. 1A also shows that the increase in well 12 dopant concentration resulted in an increase concentration profile over the local mismatch area. In actuality however, the direction in which an increase or decrease occurs will not be known until the device has been completely fabricated. This also applies to the examples of FIGS. 1B and 1C, where the direction and degree of aliasing, and the direction and degree of misalignments will not be known until final fabrication. However, it is believed that the fabrication imperfections tend to occur in a given direction with either an increasing or decreasing profile.

Figure 2A:
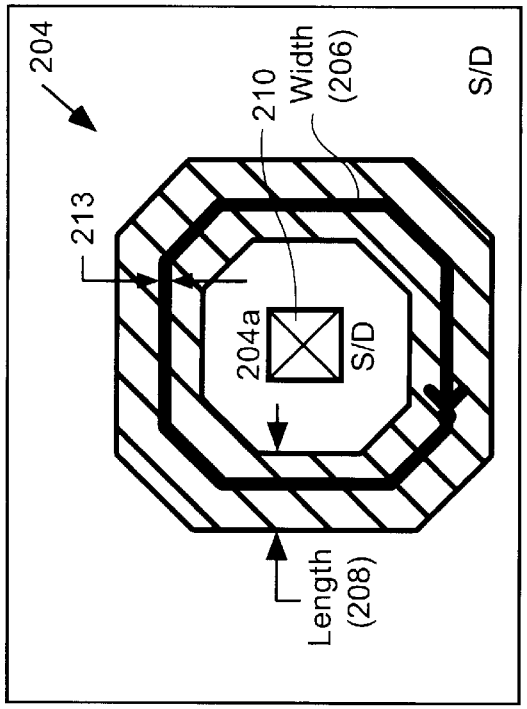
FIGS. 2A through 2D illustrate a number of exemplary geometries of a donut-shaped transistor device in accordance with one embodiment of the present invention.
Figure 2B:
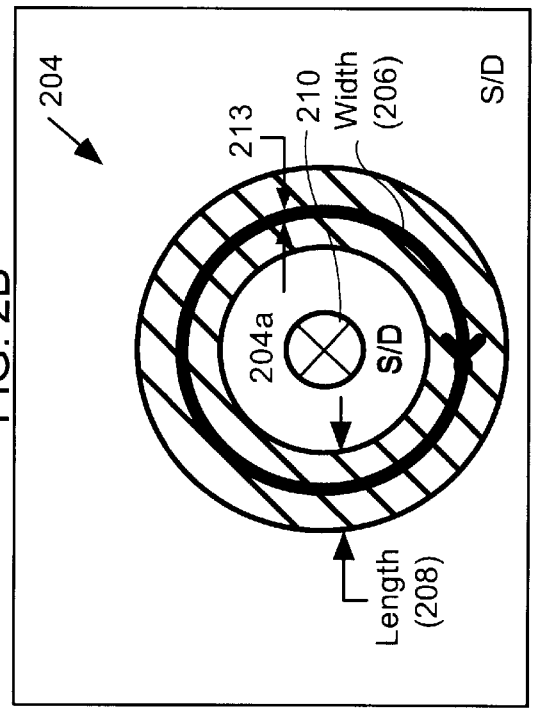

FIGS. 2A through 2D illustrate a number of exemplary geometries of a donut-shaped transistor device 204 in accordance with one embodiment of the present invention. The donut-shaped transistor device 204 shown in FIG. 2A is a square shaped donut having a gate width 206 that is determined by measuring a perimeter that is perpendicular to a gate length 208 (e.g., along a center line 213). The gate is therefore a self enclosing gate structure. As in conventional non-donut shaped transistor devices, a donut hole region 204a may either be wired as a source or drain (i.e., S/D), and the external region that surrounds the donut-shaped transistor device 204 may be wired as either a source or a drain (i.e., S/D).

Figure 2C:
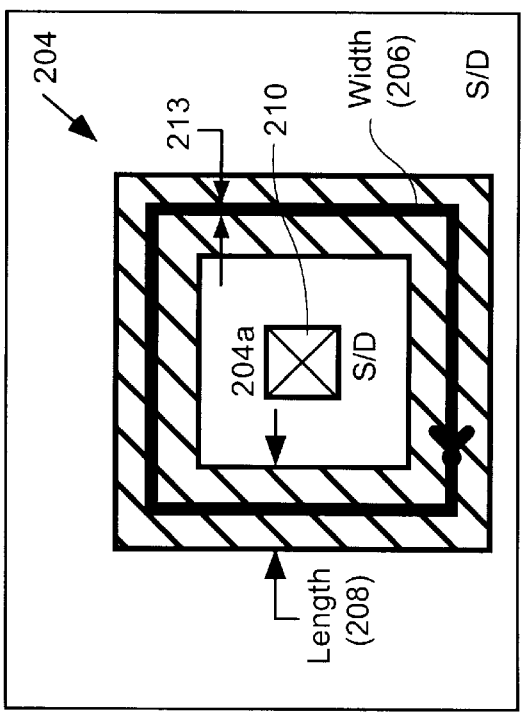
Figure 2D:
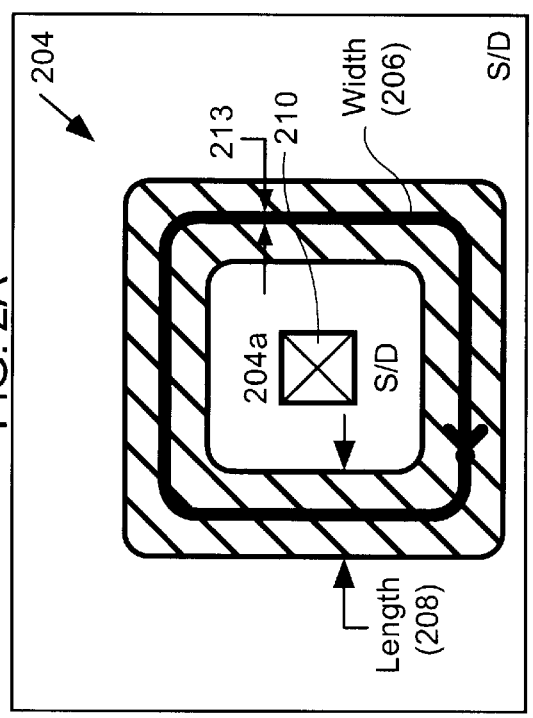

Therefore, the transistor interconnections will determine whether the doped regions of the transistor device are meant to be either a source or drain in, for example, either the donut hole region 204a or outside of the donut-shaped transistor device 204. Also shown is a via 210, which is used to interconnect to the donut hole 204a (i.e., doped diffusion region), and thereby complete a transistor interconnection. It should be borne in mind that the shapes illustrated in FIGS. 2C through 2D are provided to make clear that the actual geometric shape of the donut shaped transistor device 204 may well vary, without impacting the advantages realized when the donut shaped transistor device 204 is arranged in a "common centroid" orientation, as will be illustrated in greater detail below in FIG. 3.

Further, it is noted that when the donut shaped transistor device 204 is actually transferred to a semiconductor device, many of the photolithography processing operations will actually yield a donut shape that is slightly more rounded due to well known optical proximity effects. As such, the shapes shown in FIGS. 2A through 2B may actually end up being fabricated into a more circular donut shaped transistor device 204, as that shown in FIG. 2D. In general, it should be observed that the donut shaped transistor device 204 will advantageously not suffer from output load mismatches that are shown to occur in the transistor devices of FIG. 1C. That is, the area defined within the donut hole 204a will generally not change when a misalignment in the reticle mask occurs during the photolithography process that is used to define the polysilicon gate. This is because the area within the donut hole 204a will remain substantially the same over a doped region.

In one embodiment, the gate of the donut shaped transistor device 204 is a polysilicon gate having a gate length that is proportionate to the fabrication technology being used. By way of example, in a 0.25 micron technology process, the gate length will be about 0.25 microns. Therefore, as can be appreciated, the actual technology being implemented to fabricate the common centroid layout of the present invention may vary without limiting its advantageous resiliency to fabrication imperfections. As such, the common centroid layout techniques of the present invention are equally applicable to 0.5, 0.35, 0.25, 0.18, 0.15, 0.13, 0.10 and smaller micron technology processes.

Figure 3:
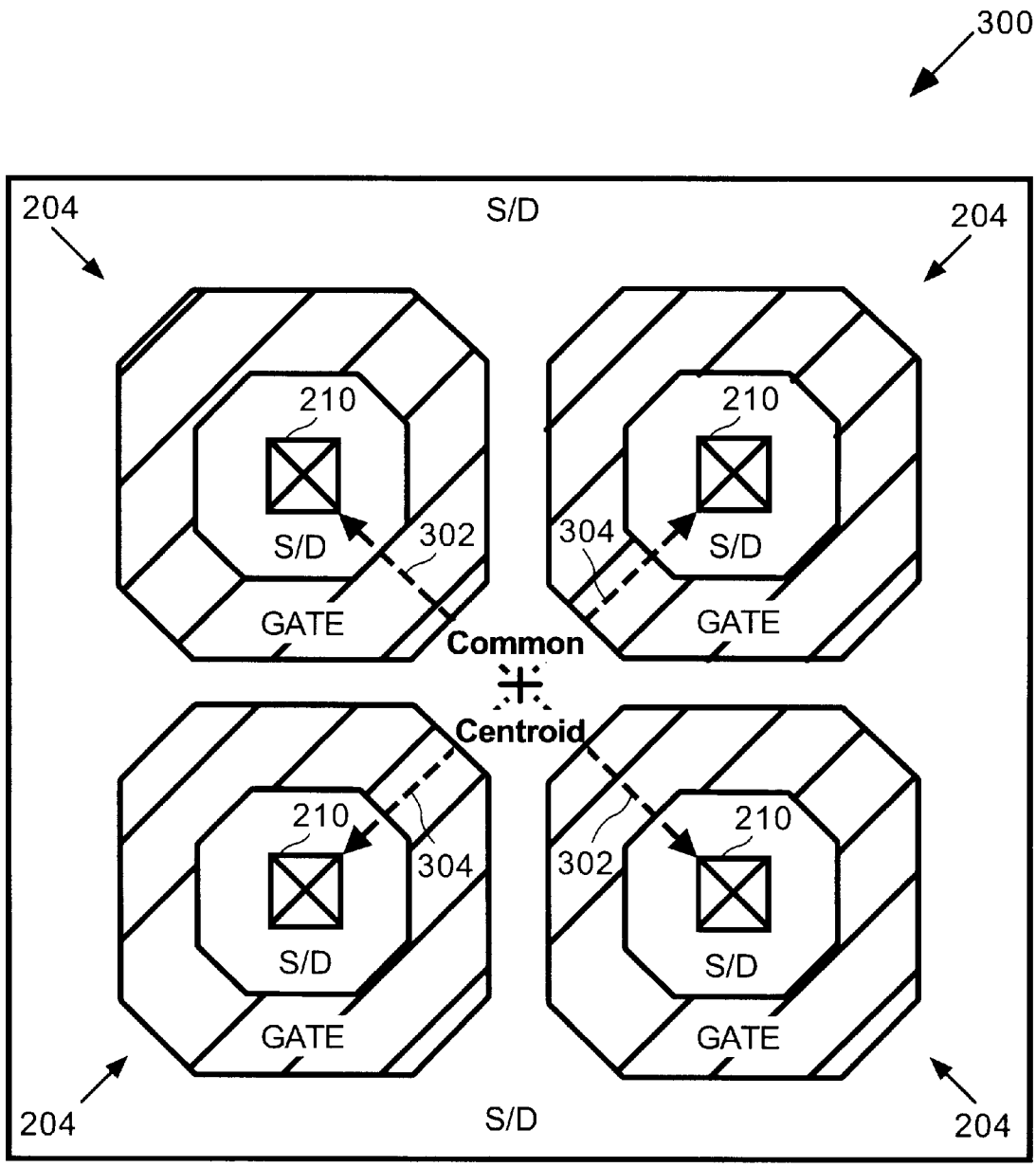
FIG. 3 shows a top view of a common centroid layout arrangement in accordance with one embodiment of the present invention.

FIG. 3 shows a top view of a common centroid layout arrangement 300 in accordance with one embodiment of the present invention. In this example, four donut shaped transistor devices 204 are laid out in a symmetric square orientation. In this manner, the gates of each of the donut shaped transistor devices 204 will surround a contact 210, which may be designed to make electrical contact to a source or drain (i.e., S/D), depending on the transistor wiring requirements of a particular device.

Figure 1B:
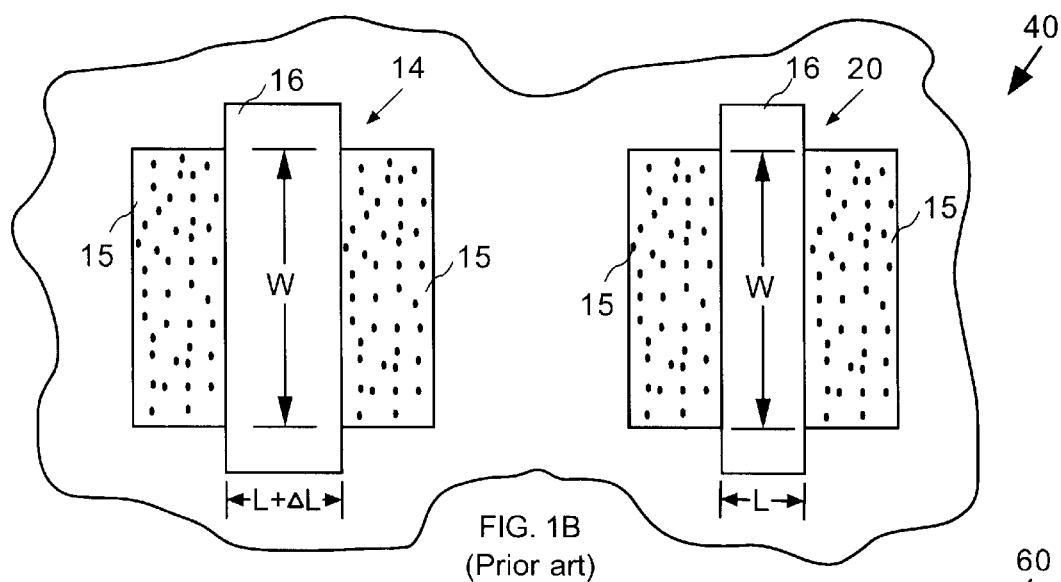
Figure 1C:
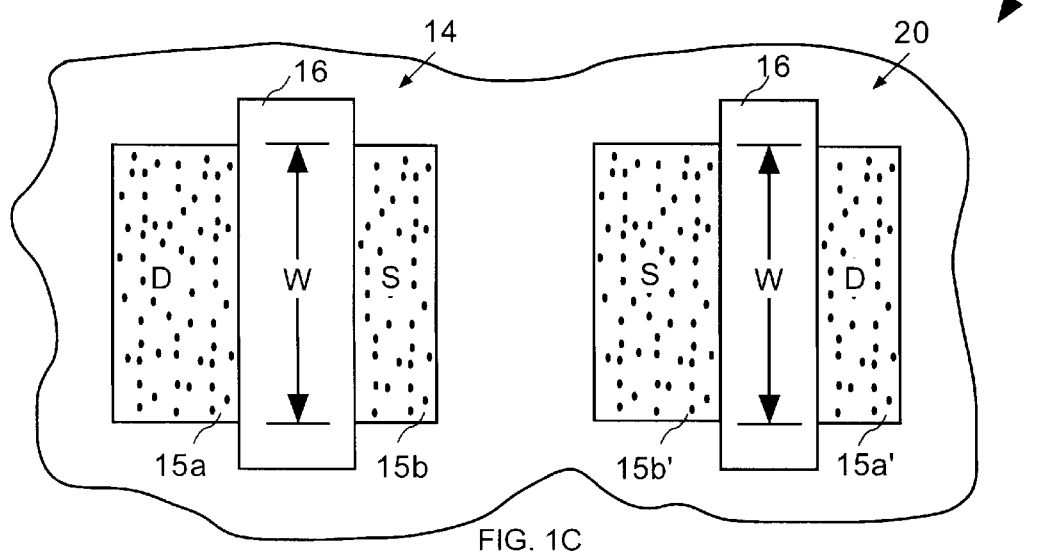

The common centroid layout arrangement 300 is particularly advantageous to withstand the various types of fabrication imperfections that were described with reference to FIGS. 1A through 1C above. By way of example, in balanced-type circuits, the common centroid layout arrangement 300 is configured such that balanced transistors are oriented diagonally across from each other, as shown by dashed lines 302 and dashed lines 304. A significant advantage that is produced by wiring balanced transistor pairs in a diagonal orientation in the common centroid layout arrangement, is that the fabrication imperfections that are believed to occur in a given direction (and increase or decrease over a local area to produce a local mismatch) will be canceled out.

That is, because each donut shaped transistor device 204 has the same circular shape, and the balanced transistors are wired diagonally across from each other, if an imperfection affects a transistor on one side of a balanced circuit, then a transistor on the other side of the balanced circuit will also be affected (thereby canceling out any imbalance introduced by the fabrication imperfection). As such, no matter what the direction of the fabrication imperfections is, the diagonally arranged balanced transistors will cancel out the fabrication imperfections effects, thereby ensuring that the drive strength, the input capacitance and the output load is matched for the set of balanced transistors in the common centroid layout arrangement 300.

Figure 4:
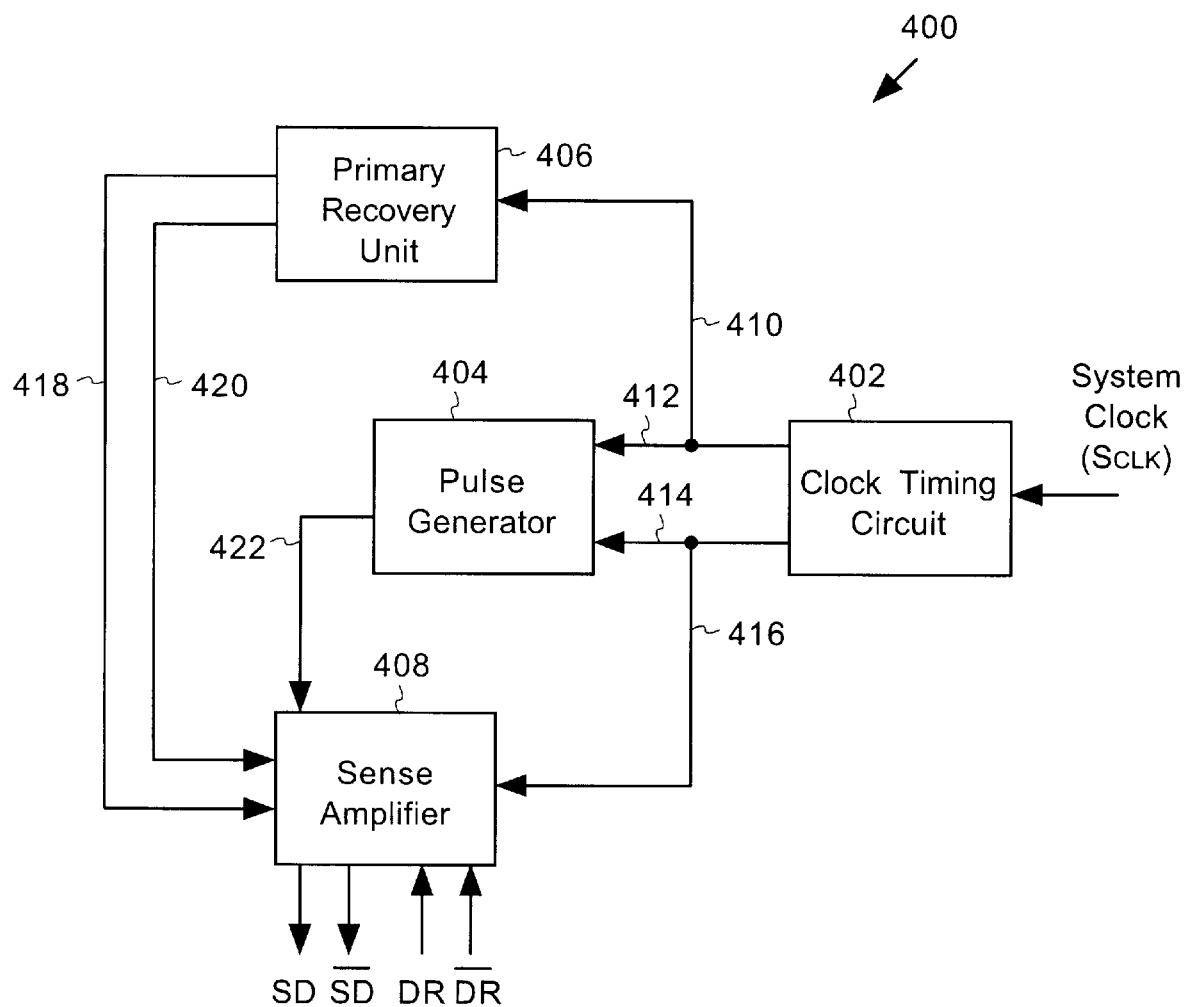
FIG. 4 is a functional block diagram of a sense amplification system used in memory accessing operations in accordance with one embodiment of the present invention.

FIG. 4 is a functional block diagram of a sense amplification system 400 used in memory accessing operations in accordance with one embodiment of the present invention. In one embodiment, a clock timing circuit 402 is preferably supplied with a system clock ($S_{CLK}$) for generating the appropriate timing signals used to trigger the various functional blocks associated with the sense amplification system 400. As shown, clock timing circuit 402 preferably generates timing signals to a pulse generator 404 and a sense amplifier 408 via signal lines 414 and 416, respectively. In a like manner, clock timing circuit 402 provides timing signals to pulse generator 404 and a primary recovery unit 406 via signal lines 412 and 410, respectively.

In this embodiment, primary recovery unit 406 is preferably suited to turn off sense amplifier 408 once the selected memory location has been accessed and appropriate amplified through sense amplifier 408 has been completed. By way of example, primary recovery unit 406 preferably generates signals through signal lines 418 and 420 that are passed to sense amplifier 408 for triggering a rapidly turn-off and recovery that is configured to precharge the circuitry contained within the sense amplifier 408 after the desired logical data has been output from sense amplifier 408. In other words, once the desired logical data has been amplified through sense amplifier 408, the primary recovery unit 406 will assist in placing the circuitry contained within the sense amplifier 408 in its original "ready to read" state.

In this embodiment, sense amplifier 408 has terminals connected to a data bus that includes a data read (DR) line and a complementary data read (/DR) line. In operation, when a small difference in voltage (i.e., which may be as low as 50 mV or less) is detected by the data bus DR and /DR, sense amplifier 408 will provide a rapid substantially full rail gain of the detected voltage difference through a sense data bus that includes a sense data (SD) line and a complementary sense data (/SD) line. Generally, the clock timing circuit 402 is preferably well suited to provide a rising edge signal (e.g., through signal line 416) to sense amplifier 408 for generating a precondition gain between SD and /SD. Once a precondition gain is provided between SD and /SD, a more rapid full rail gain is generated by sense amplifier 408.

Further shown is a signal line 422 being output from pulse generator 404 and leading to sense amplifier 408. In one embodiment, signal line 422 provides a suitable pulse for isolating DR from SD, and /DR from /SD to effectively lower the capacitance of SD and /SD. Once the capacitance for SD and /SD is lowered, SD and /SD will be allowed to more rapidly separate and define the logical data stored in the memory location being read.

Once a successful read operation has been completed, sense amplifier 408 must be placed back to its original "ready to read" state. As described above, primary recovery unit 406 provides timed signals through signal lines 418 and 420 to rapidly place sense amplifier 408 to its original "ready to read" state. Once the data has been amplified to about full rail as defined by the difference in voltage experienced by SD and /SD, primary recovery unit 406 will preferably provide a rising edge through signal line 418. The rising edge of signal line 418 is preferably configured to place an intermediate precharge node (i.e., node 530 of FIG. 5A) contained within sense amplifier 408 to a preconditioned voltage (Vpcn) through an NMOS transistor. After providing the signal line 418 to the sense amplifier 408, the primary recovery unit 406 will provide a falling edge through signal line 420 to assist in equalizing SD and /SD to their initial ready to read state. For more information on sense amplification circuitry, reference may be made to a commonly assigned U.S. Pat. application having Ser. No. 08/839,151, and entitled "Voltage Sense Amplifier And Methods For Implementing The Same." This application is hereby incorporated by reference.

Figure 5A:
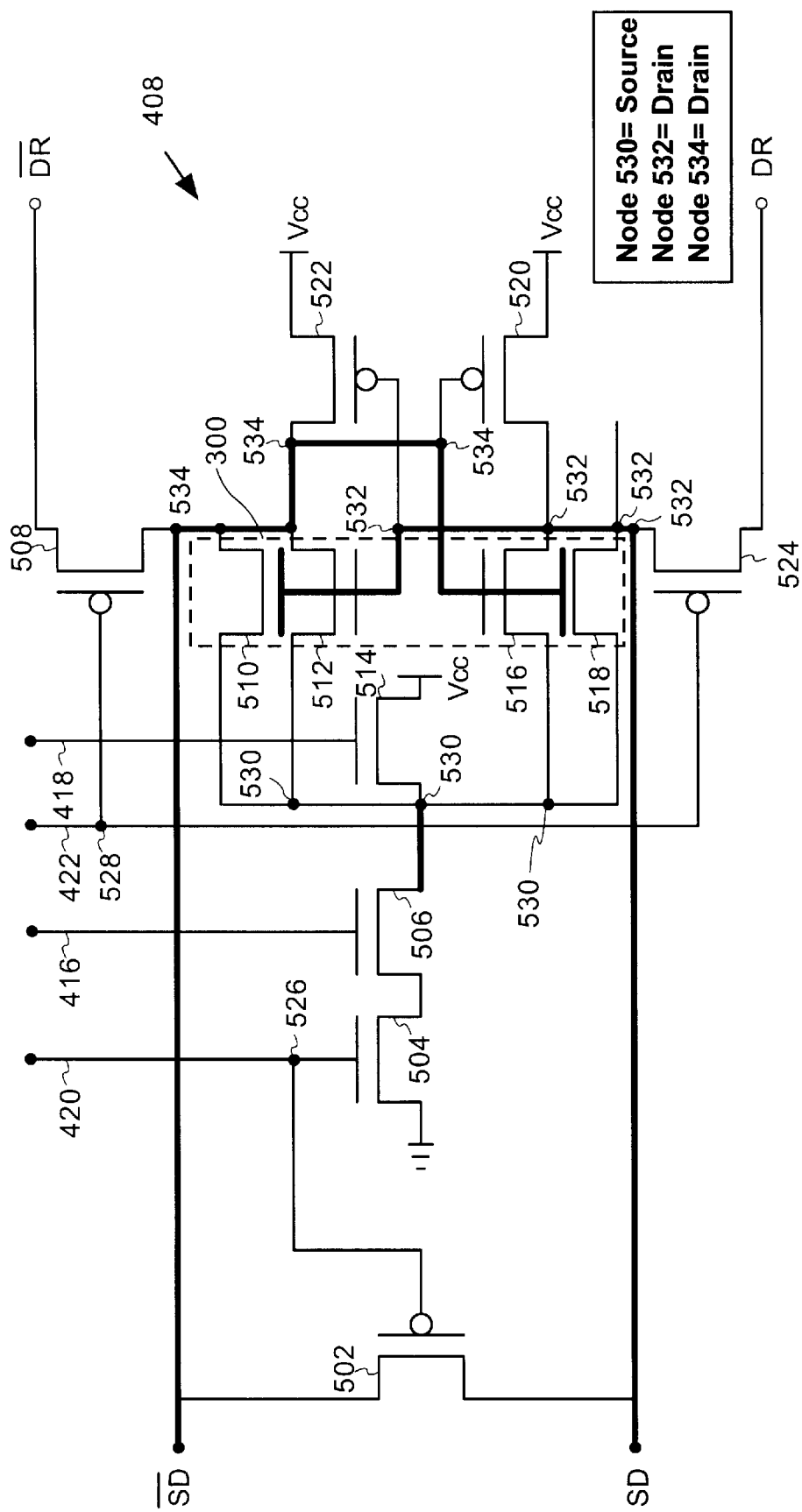
FIG. 5A shows an exemplary sense amplifier that incorporates the common centroid layout arrangement to combat local mismatches in accordance with one embodiment of the present invention.

FIG. 5A shows an exemplary sense amplifier 408 that incorporates the common centroid layout arrangement 300 in accordance with one embodiment of the present invention. As shown, /SD and SD are coupled to the source and drain terminals respectively, of a p-channel transistor 502, and the gate of transistor 502 is coupled to a node 526. Node 526 connects the gate of an n-channel transistor 504, and signal line 420. Transistor 504 preferably has the source terminal connected to ground, and the drain terminal connected to the source terminal of an n-channel transistor 506. The gate of transistor 506 is coupled to signal line 416, and the drain terminal of transistor 506 is coupled to a node 530, which in turn is coupled to the drain terminal of transistor 514. The gate of transistor 514 is coupled to signal line 418.

Node 530 also defines an electrical connection to the source terminals of n-channel transistors 510, 512, 516 and 518. Node 532 then defines the electrical connection to the drain terminals of transistors 516, 518, 520 and 524, as well as the gates of transistors 510, 512, and 522. In a like manner, node 534 defines an electrical connection to the drain terminals of transistors 508, 510, 512 and 522, as well as defining gate connections to transistors 520, 516 and 518. Further, signal line 422 is coupled to a node 528 that connects to the gate of p-channel transistor 508, as well as the gate of p-channel transistor 524.

Although the sense amplification circuitry is only one example where a common centroid layout arrangement 300 may be used to wire a balanced circuit, transistors 518 and 516 are designed to be well balanced with transistors 510 and 512, event in light of expected fabrication imperfections. Therefore, if any imperfection affects any one of transistors 516 or 518, then that same imperfection will affect one of transistors 510 or 512, because the two sets of transistors are wired diagonally in the common centroid arrangement 300.

Figure 5B:
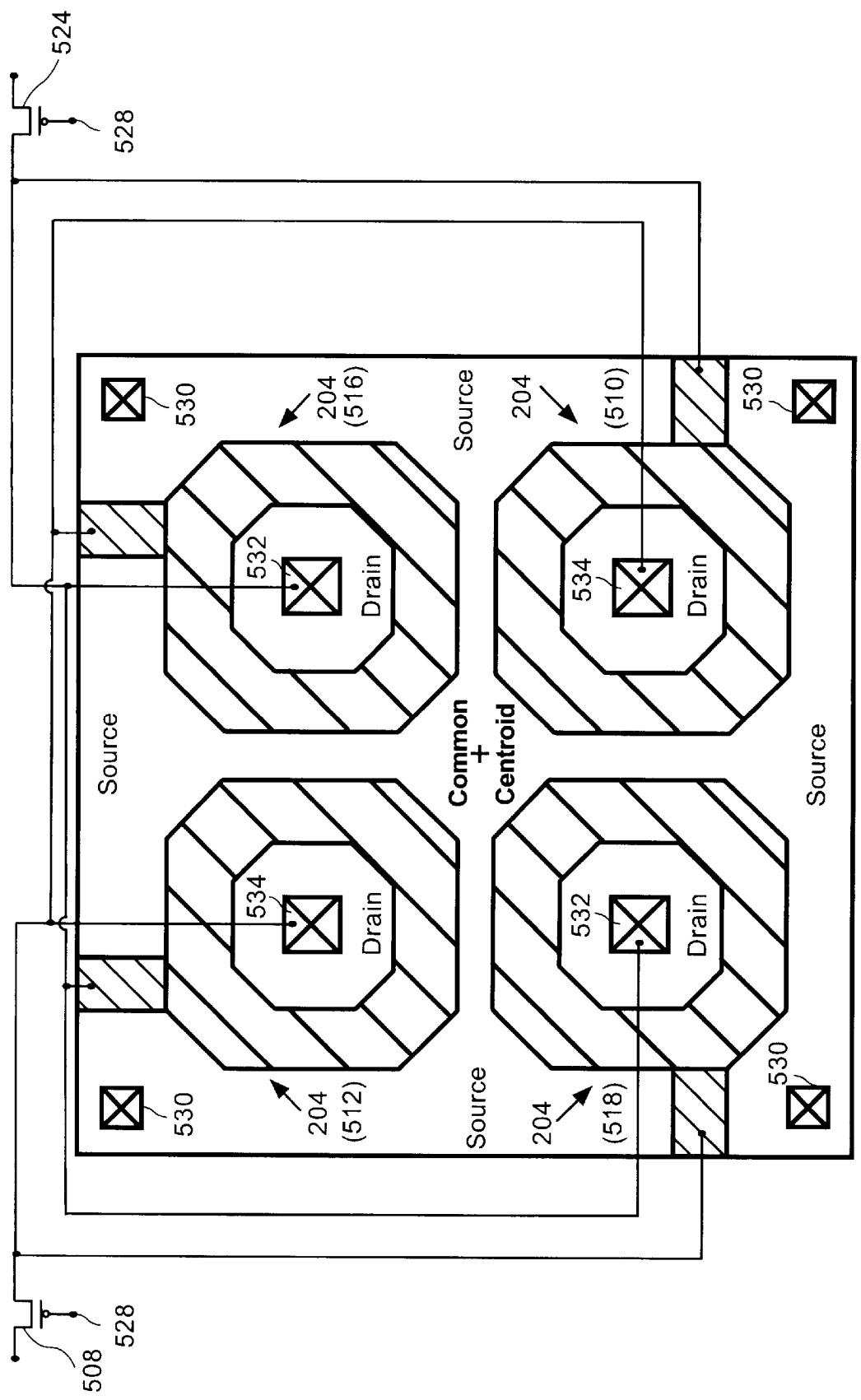
FIG. 5B shows a top view diagram of the common centroid layout arrangement of FIG. 3 after exemplary wiring is performed in accordance with one embodiment of the present invention.

FIG. 5B shows a top view diagram of the common centroid layout arrangement 300 of FIG. 3 after wiring is performed in accordance with one embodiment of the present invention. In this example, the common centroid layout arrangement 300 is shown with its electrical interconnections wired to complete a balanced circuit. As shown, transistor 516 and transistor 518 are arranged diagonally to each other, such that each of their gates are connected to the node 534. Similarly, transistor 510 and transistor 512 are arranged diagonally to each other, such that each of their gates are connected to the node 532.

As an example, assume that a gate oxide with a fabrication imperfection occurred when the common centroid layout arrangement 300 was fabricated, and that transistors 510 and 518 received a thicker gate oxide, and that transistors 512 and 516 received a thinner gate oxide. In prior art arrangements, this type of fabrication imperfections would have caused a mismatch in drive strength, input capacitance and output load. However, in accordance with present invention, the increased thickness to a transistor 510 would be counterbalanced by the increased thickness in transistor 518. Likewise, the thin gate oxide of a transistor 512 would be counterbalanced with the thin gate oxide of a transistor 516. As such, no matter what the fabrication imperfection is, or what the direction of imperfection may be, the imperfection effects will be canceled out, thereby ensuring that the balanced circuits remain balanced.

As mentioned above, although the common centroid layout arrangement is well suited for any application incorporating a balanced circuit, the balanced circuits used in memory sensing and amplifying circuits find the common centroid layout arrangement particularly advantageous. This is because sense amplifying circuits are generally required to sense very small differences in voltage, and therefore, fabrication imperfections would make such detection difficult, and if the imperfection is large, such detection may impossible. Furthermore, the sense amplifying circuitry that incorporates the common centroid layout arrangement may be used to sense and amplify data in any type of memory device.

For example, such memory devices include, but are not limited to, a ROM device, a RAM device, a DRAM device, an EPROM device, an EEPROM device, etc. For more information on memory devices, reference may be made to a book entitled "The Art of Electronics, $2^{nd}$ Edition," by Paul Horowitz and Winfield Hill, pages 812–820 (1996). This book is hereby incorporated by reference.

Although the foregoing invention has been described in some detail for purposes of clarity of understanding, it will be apparent that certain changes and modifications may be practiced within the scope of the appended claims. It should therefore be understood that the various circuit diagrams may be embodied in any form which may include, for example, any suitable semiconductor substrate, printed circuit board, packaged integrated circuit, or software implementation. By way of example, hardware description language (HDL) design and synthesis programs, such as, VHDL® hardware description language available from IEEE of New York, N.Y. may be implemented to design the silicon-level layouts. Accordingly, the present embodiments are to be considered as illustrative and not restrictive, and the invention is not to be limited to the details given herein, but may be modified within the scope and equivalents of the appended claims.

What is claimed is:

1. A balanced circuitry layout, comprising:
    a set of four transistors being symmetrically arranged around a common centroid, each of the set of four transistors having a donut shape, such that the donut shape defines a gate having a gate length, and a gate width that is defined by a perimeter around the donut shape of the gate; and
    a balanced circuit being electrically wired on the set of four transistors, the balanced circuit includes;
        a first portion of the balanced circuit having a first wiring interconnection between a first pair of diagonally oriented transistors of the set of four transistors;
        a second portion of the balanced circuit having a second wiring interconnection between a second pair of diagonally oriented transistors of the set of four transistors.

2. A balanced circuitry layout as recited in claim 1, wherein the first and second pairs of diagonally oriented transistors are aligned substantially perpendicular to each other about the common centroid.

3. A balanced circuitry layout as recited in claim 2, wherein the first wiring interconnection between the first pair of diagonally oriented transistors includes;
    a connection defined between a drain of each of the first pair of diagonally oriented transistors, wherein the drain is defined in a center region of the donut shape; and
    a connection defined between the gates of each of the second pair of diagonally oriented transistors.

4. A balanced circuitry layout as recited in claim 2, wherein one of a drain or a source region is defined within the donut shape of the gates of the set of four transistors.

5. A balanced circuitry layout as recited in claim 2, wherein one of a drain or a source region is defined outside of the donut shape of the gates of the set of four transistors.

6. A balanced circuitry layout as recited in claim 2, wherein the second wiring interconnection between the second pair of diagonally oriented transistors includes;
    a connection defined between a drain of each of the second pair of diagonally oriented transistors, wherein the drain is defined in a center region of the donut shape; and
    a connection defined between the gates of each of the first pair of diagonally oriented transistors.

7. A balanced circuitry layout as recited in claim 2, further comprising:
    a sense amplifer, implementing at least the first wiring interconnection and the second wiring interconnection of the balanced circuit to at least partially complete wiring of the sense amplifier;
    whereby the set of four transistors are configured to counterbalance fabrication imperfections to prevent imbalances in drive strength, input capacitance and output load.

8. A balanced circuitry layout as recited in claim 7, wherein the sense amplifier to is in communication with a memory device.

9. A balanced circuitry layout as recited in claim 8, wherein the memory device is selected from the group consisting of a ROM device, a RAM device, a DRAM device, an EPROM device, an EEPROM device.

10. A balanced circuitry layout as recited in claim 1, wherein the gate is a polysilicon gate.

11. A balanced circuitry layout as recited in claim 1, wherein the gate length is between about 10 microns and about 0.05 microns.

12. A semiconductor layout as design; comprising:
    a set of four transistors, each have a substantially circular gate and arranged symmetrically about a common point; and
    a balanced circuit being electrically wired using the set of four transistors, the balanced circuit includes;
        a first wiring interconnection between a first pair of diagonally oriented transistors of the set of four transistors;
        whereby the first pair of diagonally oriented transistors are substantially aligned perpendicular to the second pair of diagonally oriented transistors.

13. A semiconductor layout design as recited in claim 12, wherein the first wiring interconnection between the first pair of diagonally oriented transistors includes;
    connection defined between a drain of each of the first pair of diagonally oriented transistors, wherein the drain is defined in a center region of the circular gate; and
    a connection defined between the gates of each of the second pair of diagonally oriented transistors.

14. A semiconductor layout design as recited in claim 12, wherein the second wiring interconnection between the second pair of diagonally oriented transistors includes;
    a connection defined between a drain of each of the second pair of diagonally oriented transistors, wherein the drain is defined in a center region of the circular gate; and
    a connection defined between the gates of each of the first pair of diagonally oriented transistors.

15. A semiconductor layout design as recited in claim 12, wherein balanced circuit that is wired using the set of four transistors is configured to counterbalance fabrication imperfections.

16. A semiconductor layout design as recited in claim 12, further comprising:
    a sense amplifier at least partially implementing the set of four transistors.

17. A semiconductor layout design as recited in claim 16, wherein the sense amplifier is coupled to a memory device.

18. A semiconductor layout design as recited in claim 17, wherein the memory device is selected from the group consisting of a ROM device, a RAM device, a DRAM device, an EPROM device, an EEPROM device.

19. A balanced circuit layout design; comprising:
    a set of four transistors, each have a substantially circular gate and arranged in a substantial square arrangement about a common centroid; and
    a balanced circuit being electrically wired using the set of four transistors, the balanced circuit includes;
        a first wiring interconnection between a first pair of diagonally oriented transistors of the set of four transistors; and
        a second wiring interconnection between a second pair of diagonally oriented transistors of the set of four transistors;
    whereby the first pair of diagonally oriented transistors are substantially aligned perpendicular to the second pair of diagonally oriented transistors about the common centroid.

20. A balanced circuit layout design as recited in claim 19, wherein the first wiring interconnection between the first pair of diagonally oriented transistors includes;

a connection defined between a drain of each of the first pair of diagonally oriented transistors, wherein the drain is defined in a center region of the circular gate, and a connection defined between the gates of each of the second pair of diagonally oriented transistors.

21. A balanced circuit layout design as recited in claim 19, wherein the second wiring interconnection between the second pair of diagonally oriented transistors includes;

a connection defined between a drain of each of the second pair of diagonally oriented transistors, wherein the drain is defined in a center-region of the circular gate; and a connection defined between the gates of each of the first pair of diagonally oriented transistors.

22. A balanced circuit layout design as recited in claim 19, further comprising:

a sense amplifier at least partially implementing the set of four transistors.

23. A balanced circuit layout design as recited in claim 22, wherein the sense amplifier is coupled to a memory device.

24. A balanced circuit layout design as recited in claim 23, wherein the memory device is selected from the group consisting of a ROM device, a RAM device, a DRAM device, an EPROM device, an EEPROM device.

* * * * *